(12) United States Patent
Allard et al.

(10) Patent No.: US 8,117,865 B2
(45) Date of Patent: Feb. 21, 2012

(54) REFRIGERATOR WITH MODULE RECEIVING CONDUITS

(75) Inventors: Paul B. Allard, Stevensville, MI (US); James W. Kendall, Mount Prospect, IL (US); Alan S. Lucas, Evansville, IN (US); Andrew M. Tenbarge, Saint Joseph, MI (US); John J. Vonderhaar, Saint Joseph, MI (US); Guolian Wu, Saint Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 541 days.

(21) Appl. No.: 12/402,644

(22) Filed: Mar. 12, 2009

(65) Prior Publication Data

US 2009/0229298 A1    Sep. 17, 2009

Related U.S. Application Data

(60) Provisional application No. 61/035,775, filed on Mar. 12, 2008.

(51) Int. Cl.
    *F25D 11/00* (2006.01)
(52) U.S. Cl. ............................ 62/440; 62/449
(58) Field of Classification Search ............... 62/440, 62/447, 449, 337, 259.1; 312/401
    See application file for complete search history.

(56) References Cited

U.S. PATENT DOCUMENTS

| | | | |
|---|---|---|---|
| 3,042,780 A | 7/1962 | Gursahaney | |
| 4,543,800 A | 10/1985 | Mawby et al. | |
| 4,715,831 A | 12/1987 | Paddock | |
| 4,820,189 A | 4/1989 | Sergeant et al. | |
| 4,821,530 A * | 4/1989 | Ledbetter | 62/332 |
| 4,912,942 A | 4/1990 | Katterhenry et al. | |
| 5,064,970 A | 11/1991 | Bennett et al. | |
| 5,263,509 A | 11/1993 | Cherry et al. | |
| 5,442,518 A | 8/1995 | Beam | |
| 5,715,140 A | 2/1998 | Sinkunas et al. | |
| 5,935,433 A * | 8/1999 | Stefanini | 210/222 |
| 5,941,619 A | 8/1999 | Stieben et al. | |
| 6,658,876 B1 * | 12/2003 | Richardson et al. | 62/201 |
| 6,739,144 B2 * | 5/2004 | Yun-Ho et al. | 62/125 |
| 6,868,623 B2 * | 3/2005 | Bjornberg | 34/269 |
| 6,868,692 B2 * | 3/2005 | Choi | 62/389 |
| 7,281,391 B2 | 10/2007 | Marret et al. | |
| 7,343,757 B2 | 3/2008 | Egan et al. | |
| 7,810,345 B2 * | 10/2010 | Nebbia et al. | 62/338 |
| 2003/0121272 A1 * | 7/2003 | Kim et al. | 62/125 |
| 2004/0182104 A1 * | 9/2004 | Choi | 62/389 |
| 2005/0067174 A1 * | 3/2005 | Suzawa et al. | 174/15.5 |

(Continued)

FOREIGN PATENT DOCUMENTS

JP        11-173751        7/1999

(Continued)

*Primary Examiner* — Mohammad Ali
(74) *Attorney, Agent, or Firm* — Kirk W. Goodwin; Price Heneveld, LLP

(57) ABSTRACT

A refrigerator includes the ability to mount a variety of modules requiring utilities, such as electricity and fluids, within adjustable locations in the door of the refrigerator. The door includes a conduit extending in at least one direction and including one or more plug-in connectors for allowing a module with a mating connector to be positioned on the door for supplying operating utilities to the module. This allows the purchaser of the refrigerator to add components and accessories to the refrigerator after purchase or select desired features at the time of purchase.

23 Claims, 8 Drawing Sheets

U.S. PATENT DOCUMENTS

2006/0010829 A1 1/2006 de Sa Cavalcanti et al.
2006/0254432 A1* 11/2006 McLemore .................... 99/448
2006/0260837 A1* 11/2006 Manousiouthakis et al. ......... 174/125.1

FOREIGN PATENT DOCUMENTS

| KR | 10-2005-0004926 | 1/2005 |
| KR | 10-2011-1065531 | 9/2011 |
| WO | PCT/US2009/036968 | 8/2009 |

* cited by examiner

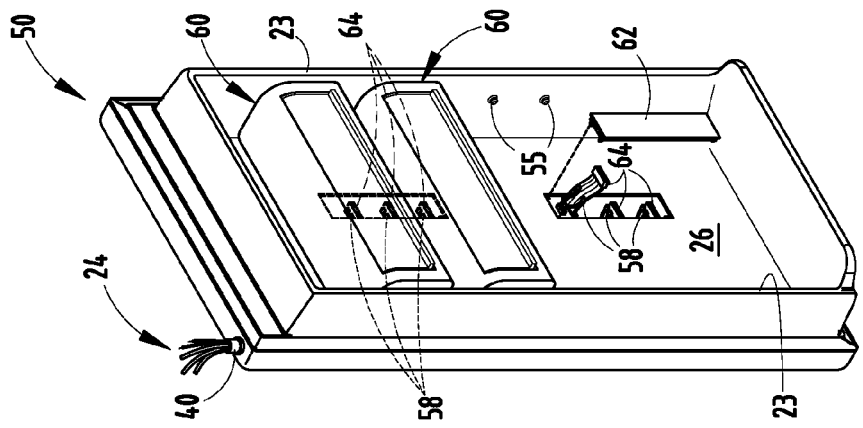
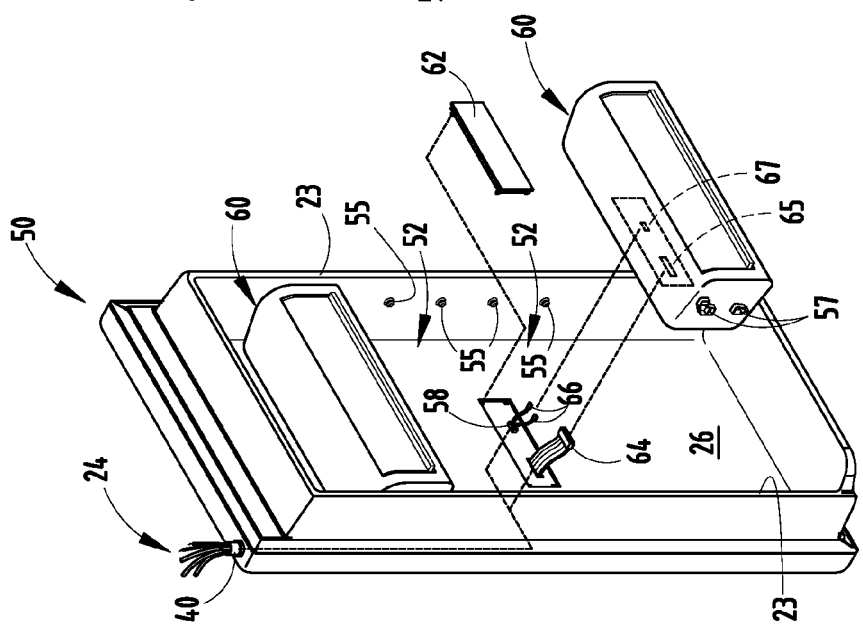
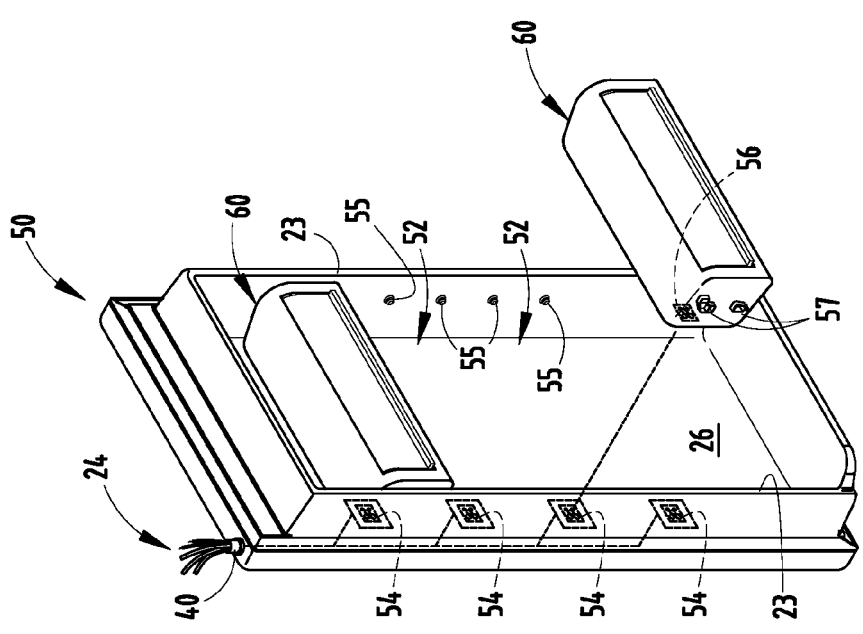

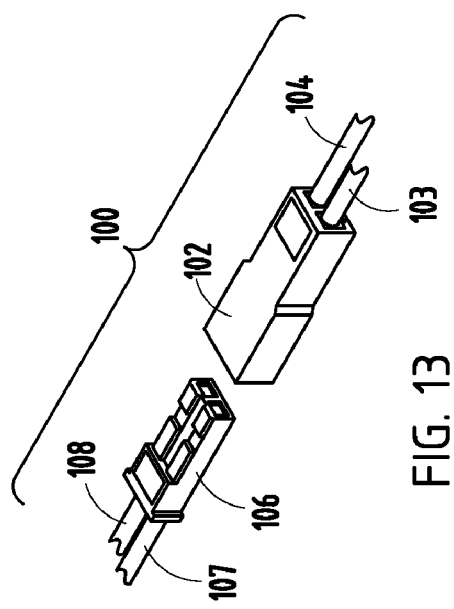
FIG. 13
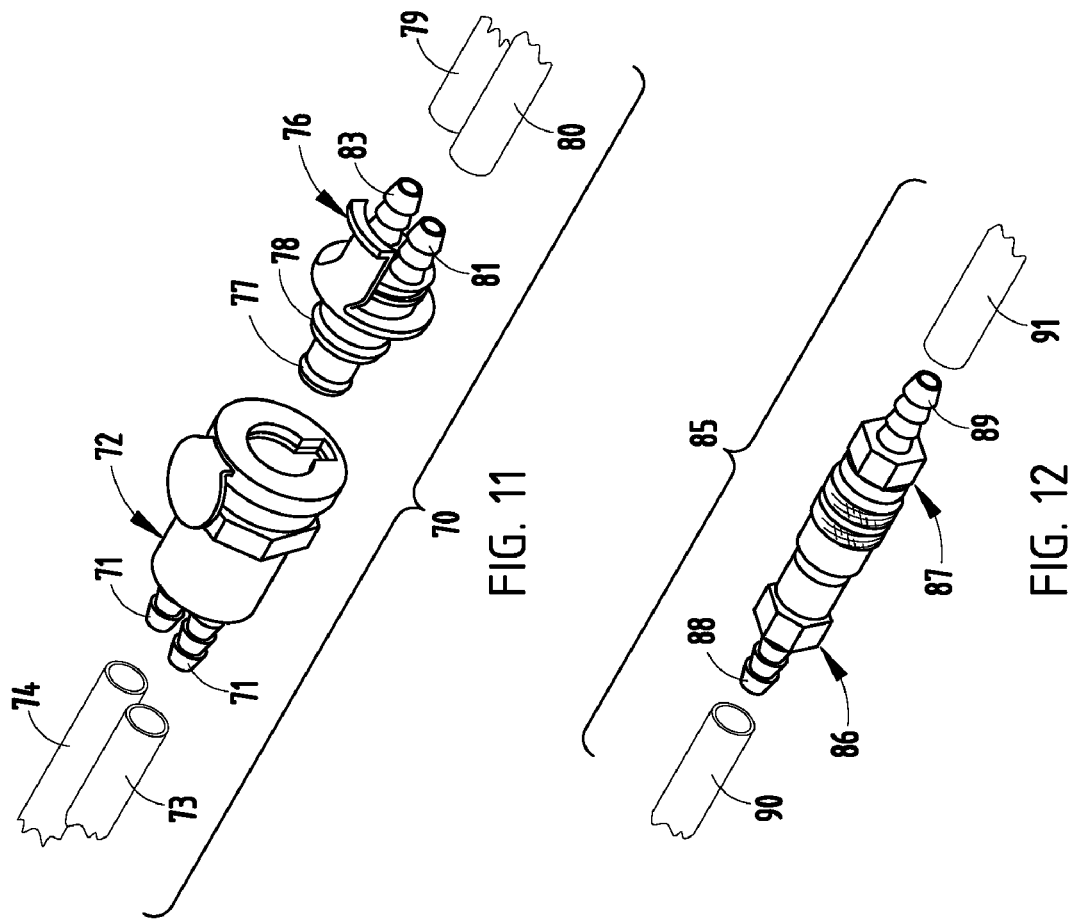
FIG. 11
FIG. 12

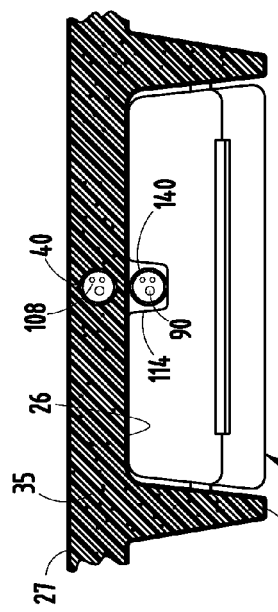
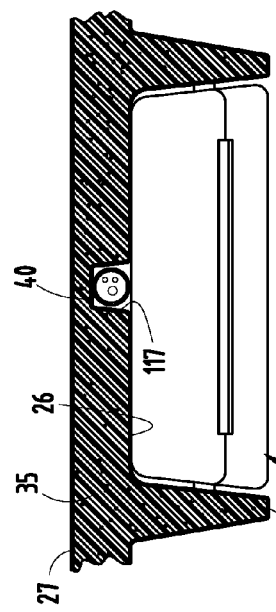
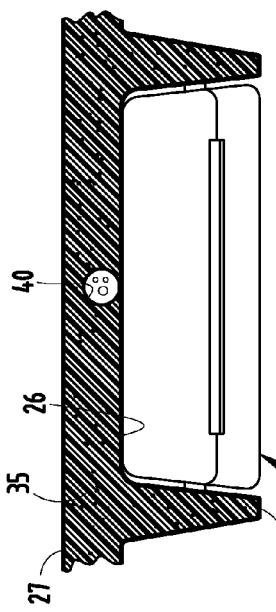
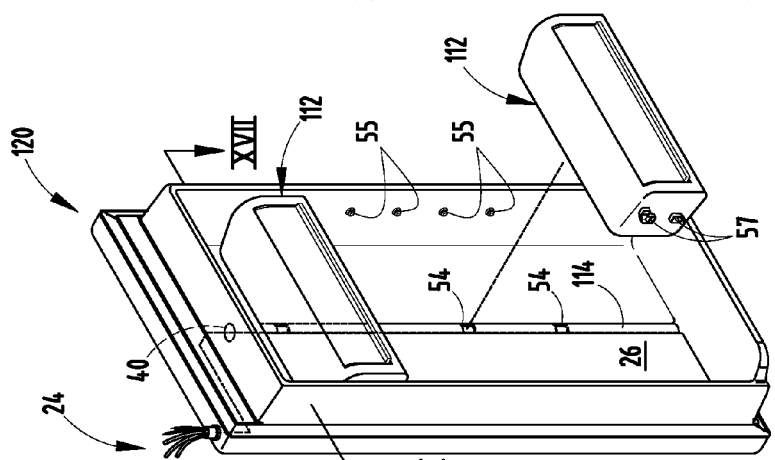
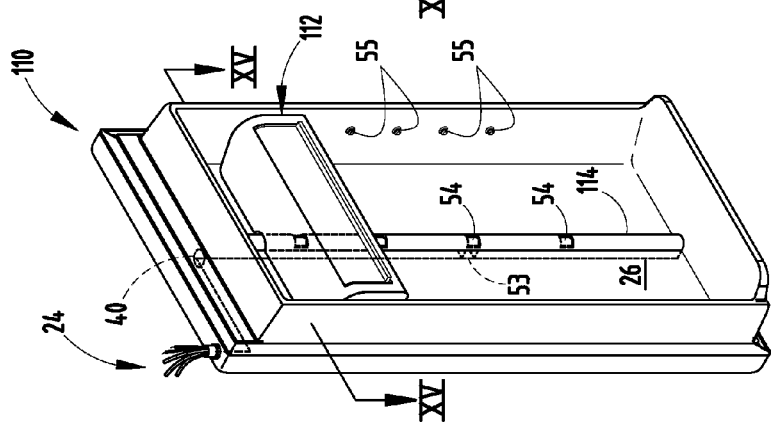

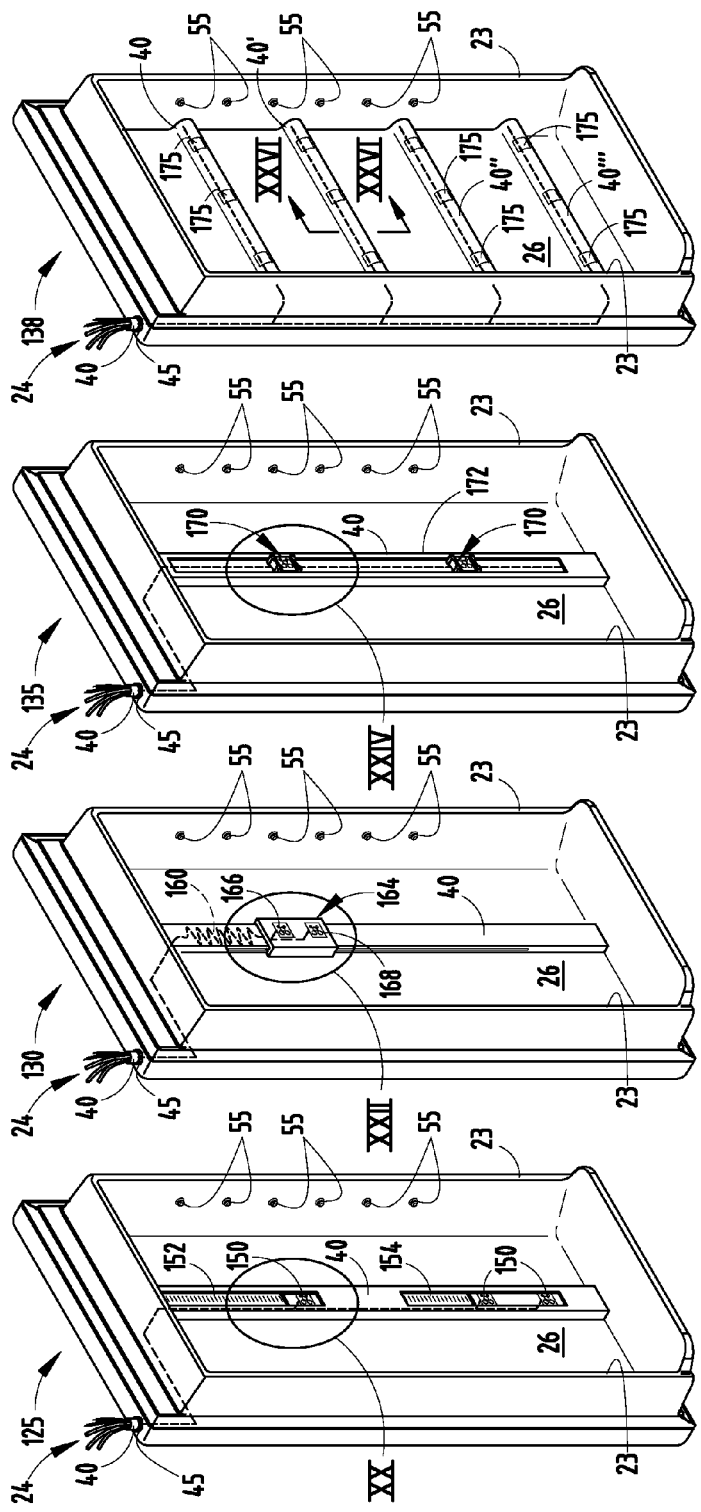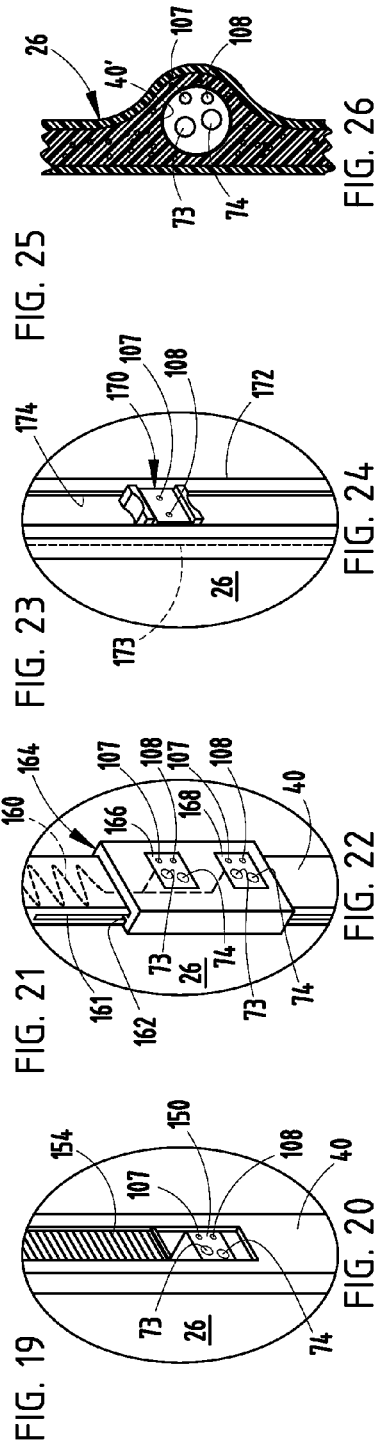

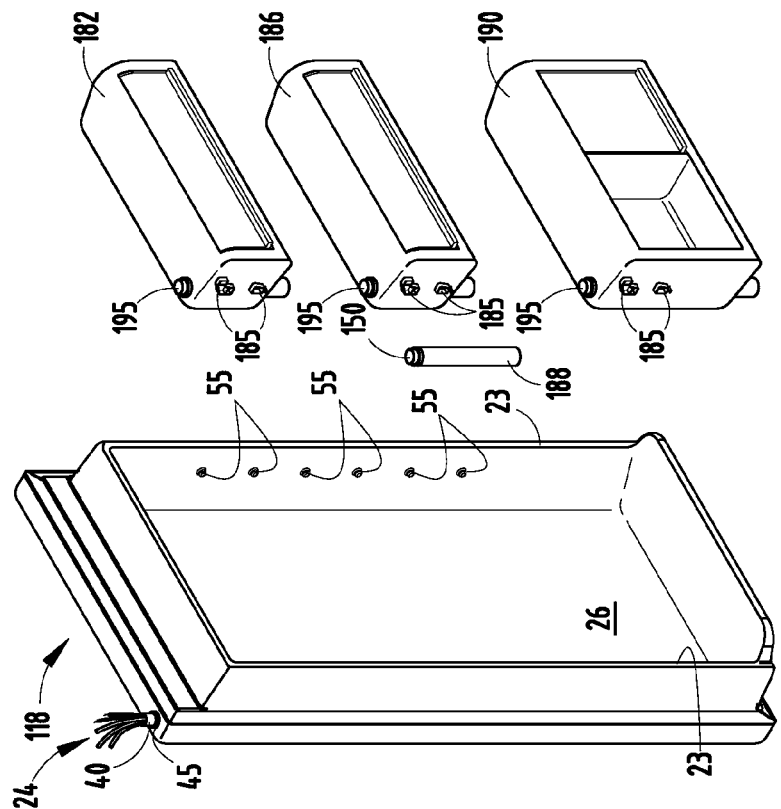
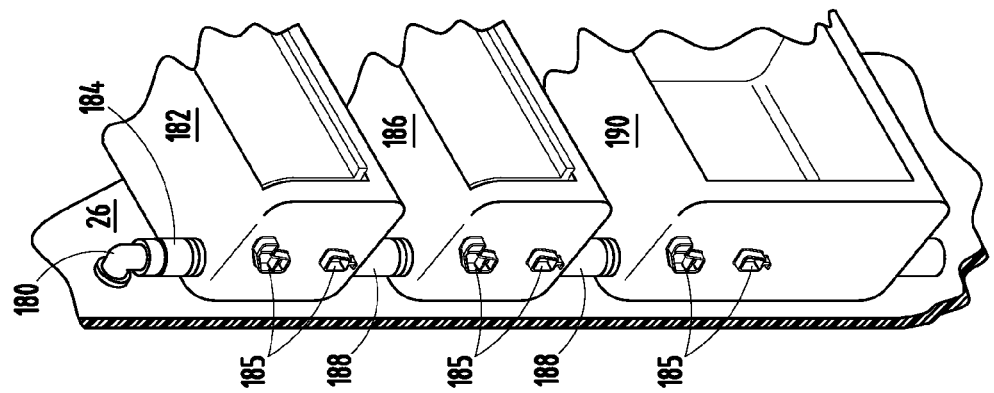
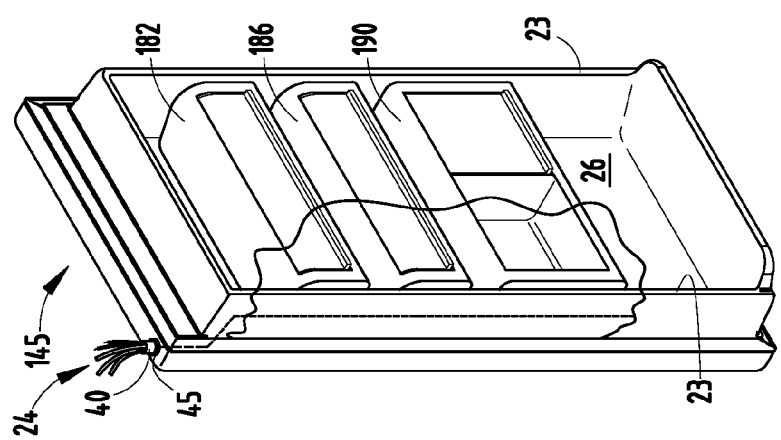

REFRIGERATOR WITH MODULE RECEIVING CONDUITS

CROSS-REFERENCE TO RELATED APPLICATIONS

This application claims priority under 35 U.S.C. §119(e) and the benefit of U.S. Provisional Application No. 61/035,775 entitled REFRIGERATOR WITH SPACE MANAGEMENT MODULES, filed on Mar. 12, 2008, the entire disclosure of which is incorporated herein by reference.

BACKGROUND OF THE INVENTION

The present invention relates to a refrigerator and specifically a refrigerator door having a conduit including utilities for supplying electrical power or fluids to plug-in modules at one or more locations.

Currently designed refrigerators may include adjustable shelves and some optional accessories, such as ice makers and water dispensers, which can be part of the original equipment of the refrigerator or, in some cases, added on to specific modules premanufactured to accommodate such additional components. A refrigerator typically will have shelving in the door which can be adjustable but otherwise has very little ability to change the configuration of the refrigerator shelving either in the cabinet of the refrigerator or in the door. There exists a need, therefore, for a refrigerator which can accommodate new accessories in modular form at owner selected locations within a refrigerator and particularly in its door. In order to accommodate such flexibility, it would be desirable to provide a refrigerator having a modular architecture to provide specialized functions, new features, and flexibility to the consumer in selecting desired features.

SUMMARY OF THE INVENTION

In order to accommodate these desirable goals, a refrigerator door includes a conduit carrying utilities for the operation of different modules. The conduit includes one or more access ports with connectors at selected locations or adjustable locations in the refrigerator door for the easy installation of such modules.

The system of the present invention accommodates such a need by providing a cabinet having a hinged access door and a conduit mounted to the door for carrying at least one of an electrical conductor and a fluid transmission tube positioned within the conduit. At least one connector is positioned at a selectable location along the conduit and coupled to at least one of an electrical conductor and a fluid transmission tube. A module requiring at least one of electricity and a fluid for its operation is mounted to the door at a selected location in one embodiment and includes a module connector for mating with the connector for receiving the necessary utilities for operation of the module.

In another embodiment, a refrigerated cabinet having an access door includes at least one hinge for mounting the door to the cabinet for opening and closing the door. A first conduit is mounted within the door for carrying at least one of an electrical conductor and a fluid transmission tube. At least one connector is coupled to a selectable location along the first conduit and to at least one of an electrical conductor and a fluid transmission tube. The system includes a second conduit mounted to an inner surface of the door and includes a connector for coupling the second conduit to the connector of the first conduit. The second conduit carries at least one of an electrical conductor and a fluid transmission tube and has at least one connector on the second conduit facing the interior of the cabinet and is coupled to at least one electrical conductor and fluid transmission tube in the second conduit. A module requiring at least one of electricity and a fluid from the second conduit for its operation includes a connector for mating with the connector of the second conduit when the module is mounted to the door at a selected location.

In a further embodiment, a refrigerated cabinet having an access door includes at least one hinge for mounting the door to a cabinet for opening and closing the door. A conduit mounted to the door for carrying one of an electrical conductor and a fluid transmission tube includes at least one connector coupled to one or more selectable locations along the conduit and to one of an electrical conductor and a fluid transmission tube. A plurality of modules are provided for mounting to the door wherein at least one module requires at least one of electricity and a fluid from the conduit for its operation and wherein at least one of the modules includes a module connector for mating with at least one connector of the conduit when the module is mounted to the door at a selected location. At least one module includes a conduit and a second connector for coupling to a second module to supply one of electricity and fluid to or through the second module.

Such a modular construction allows the consumer an upgradable refrigerator with interchangeable modules which can easily be removed for service or replacement with a different module having newer features. These and other features, objects and advantages of the present invention will become apparent upon reading the following description thereof together with reference to the accompanying drawings.

BRIEF DESCRIPTION OF THE DRAWINGS

FIG. 8 is a fragmentary perspective view, partly exploded, of a refrigerator embodying the present invention, in which a plurality of modules are shown together with a plurality of connectors on the refrigerator door;

FIG. 9 is a fragmentary perspective view, partly exploded, of a refrigerator door with an alternative embodiment of a connection port for a module coupled to the door for receiving utilities;

FIG. 10 is a fragmentary perspective view of an alternative embodiment of connection ports in a door showing a plurality of connecting ports and connectors for multiple modules;

FIG. 11 is a fragmentary perspective view of a quick disconnect connector which can be employed in any of the embodiments of the present invention for supplying two different fluids between a module and a refrigerator door;

FIG. 12 is a fragmentary perspective view of a quick disconnect coupling for supplying a single fluid between a module and the refrigerator door;

FIG. 13 is a fragmentary perspective view of a quick disconnect electrical coupling which can be used in the system of the present invention;

FIG. 14 is a fragmentary perspective view of a refrigerator door showing an alternative embodiment of the present invention wherein a conduit is centered inside the liner of the door;

FIG. 15 is an enlarged fragmentary cross-sectional view, taken along section line XV-XV, of the construction of FIG. 14;

FIG. 16 is a perspective view of a door, partly broken away, showing an alternative mounting of a conduit;

FIG. 17 is an enlarged vertical cross-sectional view, taken along section line XVII-XVII of FIG. 16;

FIG. 18 is a horizontal cross-sectional view of an alternative embodiment of the mounting of a conduit in a refrigerator door;

FIG. 19 is perspective view of a refrigerator door showing a conduit with multiple connectors and an accordion-type cover for exposing one or more connectors for use in coupling a module thereto;

FIG. 20 is an enlarged section of area XX of the door shown in FIG. 19;

FIG. 21 is a perspective view of a refrigerator door including a sliding connector coupled to a conduit for providing variable positioning of a connector for a module;

FIG. 22 is an enlarged perspective view of the area XXII shown in FIG. 21;

FIG. 23 is a perspective view of a refrigerator door showing an alternative embodiment of an electrical connector for a module in which a spring-loaded slidable connector is mounted within a track of the conduit for providing electrical power for modules which can be placed at various locations within the refrigerator door;

FIG. 24 is an enlarged fragmentary perspective view of the structure shown in the encircled area XXIV in FIG. 23;

FIG. 25 is a perspective view of a refrigerator door showing an alternative arrangement for supplying multiple connecting areas for attaching modules to a refrigerator door;

FIG. 26 is a cross-sectional view taken along section line XXVI-XXVI in FIG. 25;

FIG. 27 is a perspective view of a refrigerator door showing interconnected modules;

FIG. 28 is an enlarged fragmentary perspective view showing the details of the interconnection of the modules to one another; and FIG. 29 is an exploded perspective view of the modules shown in FIGS. 27 and 28.

DETAILED DESCRIPTION OF THE PREFERRED EMBODIMENT

Figure 1:
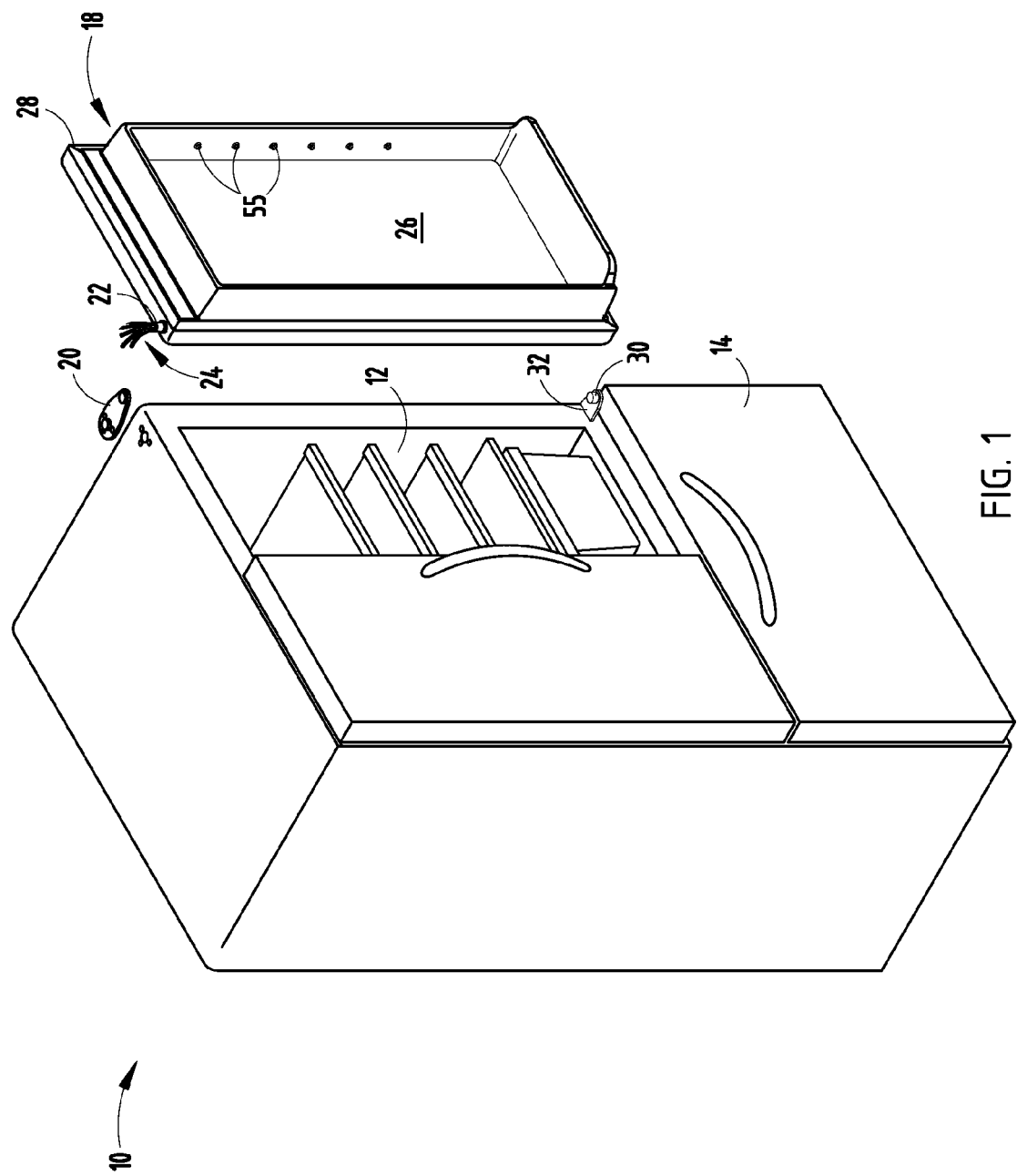
FIG. 1 is a perspective view, partly broken away, of a refrigerator embodying the present invention.

Referring initially to FIG. 1, there is shown a refrigerator 10 embodying the present invention. The refrigerator shown is illustrative only, it being understood that the refrigerator could be a single door, multiple door, left and right door, or any typical refrigerator design in terms of the refrigerator itself. Refrigerator 10 includes a refrigerated cabinet 12 which includes a freezer compartment with a closure door 14. The refrigerated cabinet 12 is enclosed by a door 18 which embodies the present invention. Door 18 is coupled to cabinet 12 by upper and lower hinge plates 20 and 30, respectively. A conduit 22 in door 18 receives a bundle of utilities 24 which extend from cabinet 12 within the door 18, as explained in greater detail below. The door includes access ports with connectors for coupling one or more modules requiring utilities for their operation and which can be mounted to the liner 26 of the door to provide flexibility for the homeowner in selecting desired modules for their particular convenience. The door 18 includes a typical magnetic seal 28 around the periphery thereof and is pivotally mounted at its upper end by pivot plate 20 and hollow pivot pin 22 serving as a conduit for the utilities 24. Plate 30 also includes a pivot pin 32 to pivotally mount door 18 at its lower end.

The modules 13 are inserted into liner 26 and are mechanically coupled to the door by conventional coupling members 34 within the side walls 23 of the door. Some modules, such as an ice maker or a water dispenser, require some form of utility, such as electrical operating power, a chilling fluid, a warming fluid, or water for dispensing. Such modules are also described in copending patent applications Ser. No. 12/343,682 entitled MODIFIED ATMOSPHERE FOR FOOD PRESERVATION filed on Dec. 24, 2008, and Ser. No. 12/343,690 entitled DEVICE AND METHOD TO PRODUCE A MODIFIED ATMOSPHERE FOR FOOD PRESERVATION filed on Dec. 24, 2008, the disclosures of which are incorporated herein by reference.

Figure 2:
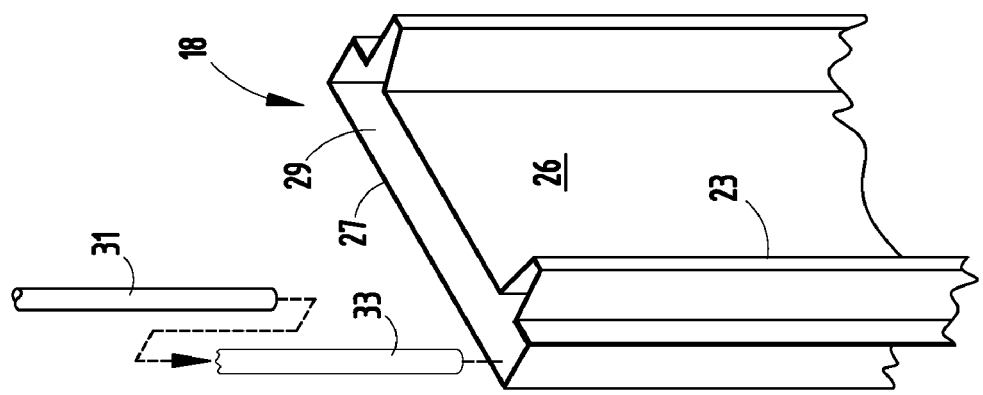
FIG. 2 is a fragmentary perspective view of a refrigerator door, such as shown in the refrigerator of FIG. 1, showing one step of its manufacturing process.

Common to each of the following described embodiments of the invention is a conduit which extends into the door and which, in one embodiment, is integrally formed in the door as an open passageway by the process illustrated in FIGS. 2-5. As seen in FIG. 2, a door 18 is shown with the inner liner 26 typically of a molded polymeric material and an outer skin 27 coupled thereto. The space 29 between the outer skin and liner 26 is open and a mandrel 31, such as a tubular member, is inserted in a polyethylene sleeve 33 and positioned within the space 29 at a desired location which may vary from door to door.

Figure 4:
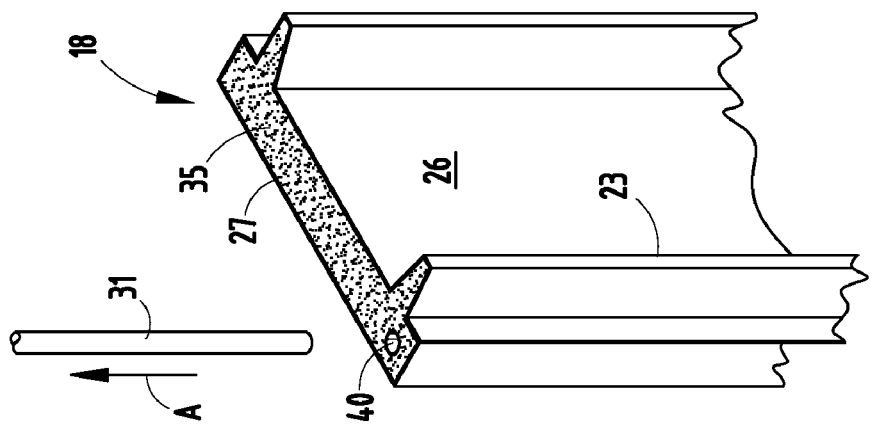
FIG. 4 is a perspective view of the door shown in FIGS. 2 and 3, shown during a third step of its manufacturing process.
Figure 3:
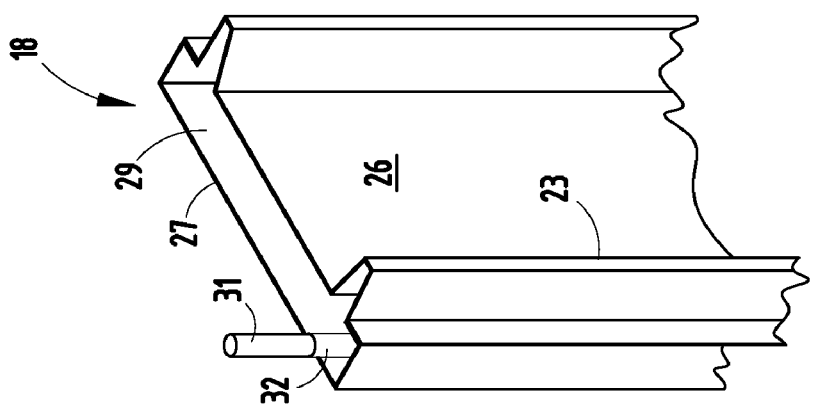
FIG. 3 is a fragmentary perspective view of the door shown in FIG. 2, shown during a second step of its manufacturing process.

In the embodiment shown in FIG. 3, the sleeve 33 and mandrel 31 are positioned in the corner of the door, and the door is then foamed with an insulative foam 35, as seen in FIG. 4. Subsequently, the mandrel 31 is removed, as shown by arrow A in FIG. 4, leaving a cylindrical passageway defining a conduit 40 extending vertically substantially the height of door 18. The conduit 40 may be the passageway formed as shown in FIG. 4 or may be lined with a cylindrical tube or sleeve 42 for receiving a bundle of utility supplying electrical conductors or fluid tubes for electrical and fluid transmission from either the top of the door, as seen in FIG. 1, or at the bottom of the door. Utility conduits typically fit within a sleeve 42 which extends through an aperture 45 in end cap 44 positioned over the ends of the door 18 to complete the door construction. It is understood that a lower end cap is likewise employed. Not all doors will include end caps, and, in such event, other pathways for providing the utilities will be employed.

Figure 6:
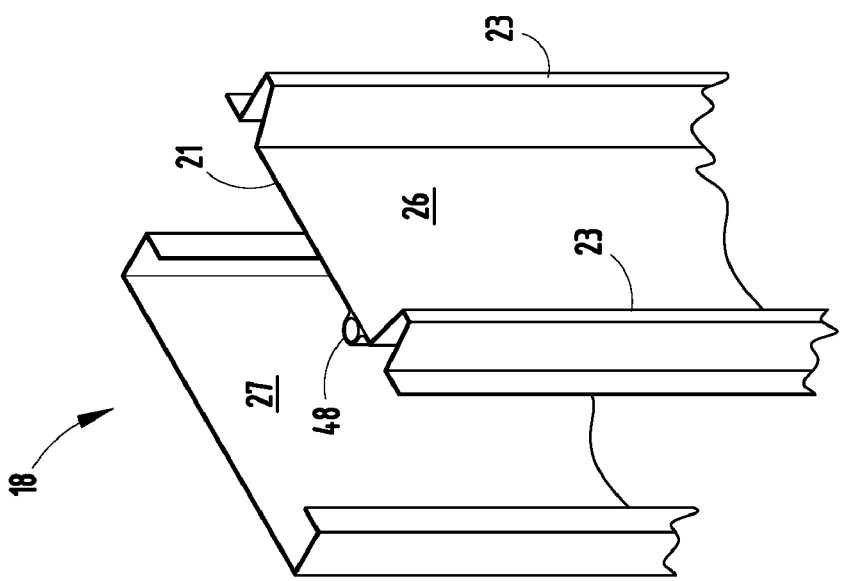
FIG. 6 is a fragmentary perspective view of an alternative embodiment of the invention in which a conduit is positioned within a door, such as shown in FIGS. 2-5.

Also, instead of foaming a conduit or passageway utilizing mandrel 31, a tubular conduit, such as 48 (FIG. 6), can be secured to the inner surface 21 of liner 26 by a suitable bonding adhesive and coupled to utilities again through an aperture 45 in an end cap, such as 44 (not shown in FIG. 6). Thus, instead of forming a conduit directly in the foam insulation of the refrigerator door, a physical tubular conduit can be placed either within the door (FIG. 6) or on the liner 26, as illustrated in FIG. 7.

Figure 7:
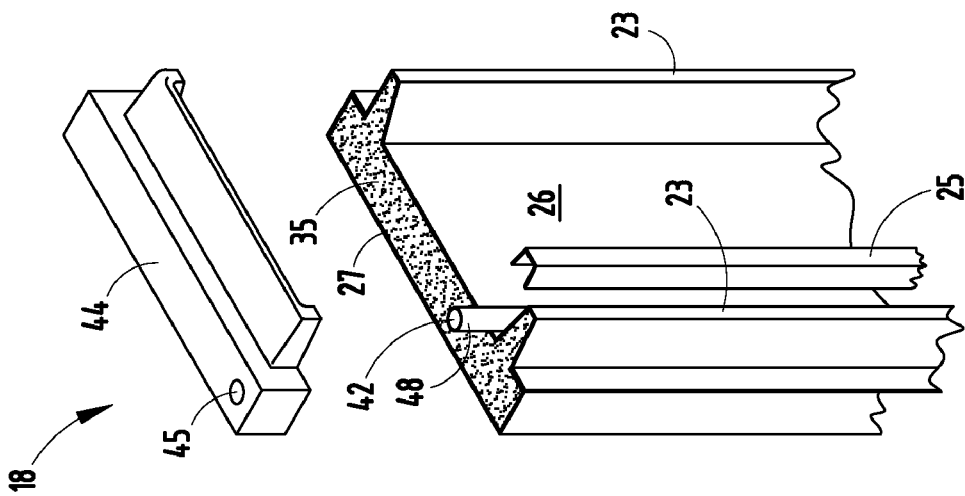
FIG. 7 is a fragmentary perspective view of an alternative embodiment in which a conduit is positioned on the inner liner of a door.
Figure 5:
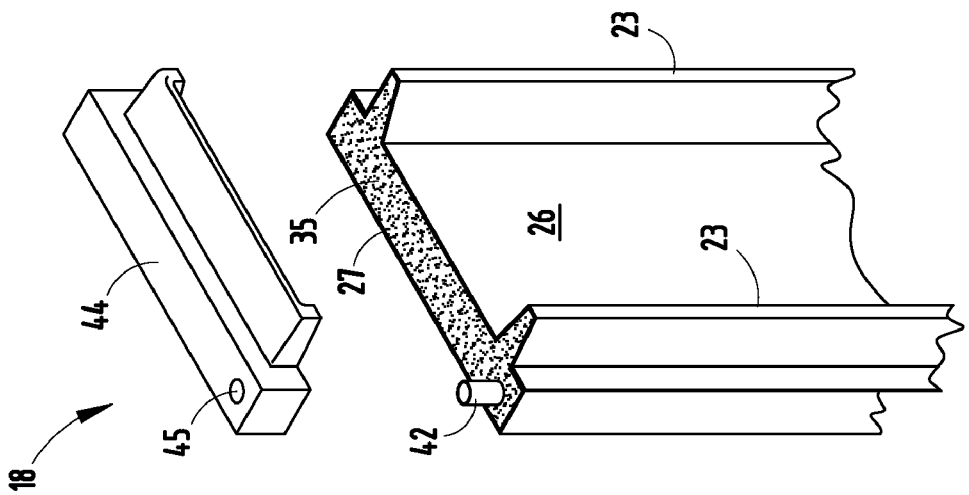
FIG. 5 is a fragmentary perspective view of the door shown during a subsequent step of the door manufacturing process.

In FIG. 7, a tubular member 48 can also define a conduit 40 for the electrical and fluid utilities supplied to the door 18. In this embodiment, the utilities are supplied through an aperture 45 in end cap 44, as in the previous embodiment, but, instead of directly going into the sleeve 42 shown in FIG. 5, are coupled by right angle connectors through the liner and into the external conduit 48 located in the corner of one of the walls 23 of liner 26. A cover 25 typically is employed to enclose the utilities carrying conduit 48. Conduit 48 in the various embodiments extends substantially the length of the height of door 18 to make available the electrical conductors and fluid tubes needed for modules to be placed in the doors and coupled to the utilities as described in the figures below.

Referring now to FIG. 8, there is shown a refrigerator door 50. Door 50 can be manufactured as described in connection with FIGS. 2-7 to include an internal or external conduit which leads to mounting ports 52 at spaced locations within the interior 26 of the refrigerator door. Each port 52 includes a connector 54 which is coupled to the utilities 24 which include, for example, electrical conductors and fluid conductors, for supplying utilities to one or more of a plurality of modules 60 requiring electricity, a cooling fluid, water, a heated fluid, or the like, for providing the module with operating utilities. Each of the modules 60 likewise include a connector 56 which mates with connectors 54 when the module is inserted within the refrigerator door. Although four connectors are shown in FIG. 8 with a pair of modules 60, one or more of the connectors and modules may be employed. Thus, the system shown in FIG. 8 can accommodate from one to four powered modules. Ports 52 include not only quick disconnect connectors (as described below with reference to FIGS. 11-13) coupled to the conduit 40 and utilities contained therein but also mounting brackets 55 mounted on the inside of the door walls 23 and correspondingly interengaging mechanical mounting brackets 57 on the sides of the modules 60, such that the modules can be plugged into the ports 52 and make simultaneous mechanical connection with door 50 as well as electrical an fluid connection through mating connectors 54, 56 to the supply conduit 40.

Another arrangement for supplying a module, such as module 60, in a door 50 is shown in FIG. 9 in which the conduit 40 extending through the interior of door 50 manufactured in the manner previously described terminates in a trough 58 with a snap-on cover plate 62, such that the utilities, such as a ribbon electrical connector 64 and quick disconnect fluid connectors 66 can be tucked within the trough 58 when not employed and covered by plate 62. When a module, such as module 60 which mates with connectors 64 and 66, respectively, is installed within the port 52 as described in connection with FIG. 8, the cover plate 62 is removed and the connections made between the mating connectors and the module 60 is mounted to the port through the mechanical brackets 55 and 57. Openings or troughs 58 provide access to one or more discreet locations within the interior of the refrigerator door.

As seen in FIG. 10, a pair of vertically spaced connectors, such as connector 64, are placed in troughs 58 with the cover plate 62 covering the connectors when not in use. When modules, such as module 60, are installed one or more of the connectors 64 can be extended for coupling to supply operating electrical power or fluids to the module being installed. Not all modules will require utilities and, in such cases, snap-on cover 62 can remain in place when a module does not need operating utilities for its use.

The type of connectors employed for coupling a module to the refrigerator door connectors, such as 54, 56 and 64, 66 shown in FIGS. 8-10, are shown in FIGS. 11-13. In FIG. 11, there is shown a dual fluid quick disconnect connector 70 which includes a female connector 72 which has nipples 71 which couple to a pair of fluid conduits 73 and 74, such as water, coolant fluid for refrigeration, or the like. When disconnected from male connector 76, ball valves seal the gas or liquid in tubes 73, 74 from escaping connector 72 which is mounted to the refrigerator door. A male connector 76 is mounted to a module and couples to the female connector 72 when a module is installed. Connector 76 includes fluid sealing O-rings 77 and 78 for the concentric passageways for the two different fluids, which are coupled by connector 70 from the refrigerator door conduits 73 and 74 to the modular conduits 79 and 80 which attach to nipples 81 and 83 of male connector 76.

FIG. 12 is a perspective view of a single fluid interconnection 85 which includes a pair of fittings 86 and 87 with a quick disconnect coupling therebetween. Fitting 86 includes a nipple 88 coupled to fluid conduit 90 extending from the refrigerator door while fitting 87 includes a nipple 89 coupled to conduit 91 associated with a module. Again, when disconnected, connector 86 is sealed. Not all connectors need to include seals and other types of commercially available connectors, such as available from John Guest International Ltd., can be employed.

FIG. 13 shows a typical electrical quick disconnect coupling 100 which includes a female section 102 with a pair of conductors 103 and 104 which are coupled to a module to be inserted in the refrigerator door. The coupling also includes a male section 106 for the pair of conductors 107 and 108, which couple to the refrigerator door supply conduit 40 as described in the previous embodiments. The same type of connectors or other similar commercially available connectors can be used for the quick coupling and decoupling of a module to the conduits mating connectors of the refrigerator doors in each of the embodiments.

FIGS. 14 and 15 show yet another embodiment of a refrigerator door 110 embodying the present invention and which includes a liner 26 and first and second conduits 40 and 140. The first conduit 40 is positioned in the insulated space between liner 26 and skin 27 and positions a connector, such as 53, at a location on the liner surface of door 110 such that a second conduit 140 with utility wires and tubes contained therein can later be mounted to the door 110. Conduit 140 will have a connector, such as 54, which mates with connector 53 and supplies a plurality of spaced connectors 54 along conduit 140 for receiving modules, such as module 112. Thus, the two conduit system allows a first conduit with a single connector to be manufactured in all refrigerator doors and then, as desired, the customer or retailer can retrofit the door by mounting a snap-in second conduit which mates with the first conduit and provides utilities at various locations to optional modules. The conduit 140 includes a plurality of connectors 54, such as in the embodiment shown in FIG. 8, which may include both types of connectors 70, 85, and 100 as described in the previous drawing figures to supply modules, such as module 112, at selected vertically spaced locations operating utilities for the module 112. The utility wires and tubes can extend through an aperture 45 in the upper edge of the door at the pivot point and into conduit 40 in a conventional manner.

FIG. 15 is a vertical cross-sectional view of the positioning of the conduits 40 and 140 and utility conduits 90, 107, and 108, for example, as in the previous embodiment, within conduits 40 and 140. A decorative shroud 114 (FIG. 15) with openings at spaced-apart locations, as seen in FIG. 14, to expose connectors 54 may be employed to cover conduit 140. As in the previous embodiments, the sides 23 of the refrigerator door include conventional mounting brackets 55 for receiving modules, such as module 112.

In the embodiment shown in FIGS. 16 and 17, a conduit 40 is formed in a recess 117 in the back wall of liner 26 of door 120 to conceal the conduit and provide additional space for the modules 112 inserted therein. These modules, like the remaining modules, include mechanical coupling brackets 57 which engage brackets 55 in the refrigerator door for securing the modules mechanically to the refrigerator. The modules 112 also include connectors 56 which mate with connectors 54 in the refrigerator door for supplying utilities from the conduit 40 to the modules.

In addition to the door construction shown in FIGS. 14-17, a conduit 40 can be embedded as shown in the horizontal cross section of FIG. 18, which represents the molding of the conduit 40 in the center insulated area of the liner in a process similar to that shown in FIGS. 2-5, except the positioning of the conduit is centered in the liner 26 to mate with a module, such as module 112, positioned therein and coupled to the door utilizing coupling brackets 55 and 57 in the door and module, respectively.

FIGS. 19 and 20 show an alternative embodiment of the invention in which a refrigerator door 125, including a liner 26, has the conduit 40 formed in a rectangular channel on the surface of the liner facing the cabinet of the refrigerator. The conduit includes a plurality of spaced-apart connectors 150 at various locations which are selectively covered by an accordion or foldable cover 152 and 154, as best seen in FIG. 20. The movable covers 152, 154 selectively expose connectors 150 such that a module, such as modules 60, 112, and 118) can be inserted therein and receive the utilities necessary for operation of the modules. Door 125 includes the usual coupling mechanism, as does the module, for coupling the module mechanically to the door as well as electrically and fluidly to the connectors 150.

Another embodiment of the invention is shown in FIGS. 21 and 22 in which a conduit 40 is again mounted to the liner 26 of door 130 and includes utilities which are coiled in a slacked condition represented by dashed lines 160 in the figures. The utilities extend from aperture 45 in door 130 through the insulation into the channel-like conduit 40. Conduit 40 includes, in this particular embodiment, a guide slot 161 (FIG. 22) and guide tab 162 on a carrier 164 which includes connectors 166 and 168 for receiving the utilities through coiled or slack conductors and tubes 160. Thus, the adjustable positioning of carrier 164 allows a module to be positioned substantially anywhere along the vertical height of door 130 by moving carrier 164 to a desired location, which can be selected by the owner of the refrigerator.

In the embodiment shown in FIGS. 23 and 24, the door 135 allows similar flexibility, however, it employs an electrical only movable connector 170 which comprises a push-spring contact in a track 172 having electrical conductors 173 and 174 on opposite sides, similar to a track for used for track lighting. By compressing the opposite sides of connector 170, the socket can be moved upwardly and downwardly to the desired adjusted position. In the embodiment shown, two such connectors 170 are shown, although additional connectors can be mounted within the track 172, if desired, to accommodate more than two modules at infinitely adjustable positions.

Another embodiment of the invention is shown in FIGS. 25 and 26 in which a refrigerator door 138 includes horizontally extending conduits 40, 40', 40", and 40''' which are vertically spaced and molded into the liner 26, as shown in FIG. 26, to include utility tubes and conductors, such as 73, 74, 90, and 107, 108, respectively, as shown in connection with the connector diagrams of FIGS. 11-13. At horizontally spaced locations along conduits 40-40''', there are provided connectors, such as 175, which, like the remaining connectors in the other embodiments, contain quick disconnect couplings, such as shown in FIGS. 11-13, for plugging a module, such as module 60, 112, and 118, into the conduits for receiving utilities extending through aperture 45 in the top of door 138. By providing horizontally spaced connectors 175, the module connector can be located at the left, center, or right edge of the module as desired, which provides more flexibility for positioning a module within the door 138.

In addition to providing conduits within the refrigerator door itself, it is possible to utilize modules as the structure for extending utilities throughout the inside of a refrigerator door, as seen in FIGS. 27-29. In these figures, there is shown a refrigerator door 145 which receives utilities through an aperture 45 in the upper or lower corner of the door in a conventional manner. The utilities, however, extend through an elbow 180 (FIG. 28) from the liner 26 into a first module 182 by means of a quick disconnect coupling 184. Module 182 is coupled to the liner by standard coupling brackets 185, which communicate with brackets 55 in the inner edges 23 of the door, as seen in FIG. 29.

Module 182 may utilize the utilities such as fluid or electricity provided through elbow 180 and connector 182 or merely pass the utilities through to a second module 186 spaced below module 182 and coupled thereto by means of a second quick disconnect coupling 188. Module 186 also can be coupled to a lower module 190 through a quick disconnect coupling 188 to receive operating power and fluids therefrom. Modules 182, 186, and 190 may be powered by utilities through the conduits or, in the case of modules 182 and 186, it may not require the utilities but act as a passageway for the module 190. In this instance, it is not necessary to mold the conduit within the refrigerator door but only provide a coupling at elbow 180 such that the modules can be coupled thereto and positioned within the refrigerator door.

Thus, with the present invention, a great deal of flexibility of the options available to the consumer and offered by a retailer is possible. As new modules become available, the fluids, such as coolant liquids, cooled air, inert gases, heated air, electrical power and binary data, can be supplied utilizing the system of this invention. It will become apparent to those skilled in the art that various modifications to the preferred embodiments of the invention as described herein can be made without departing from the spirit or scope of the invention as defined by the appended claims.

The invention claimed is:

1. A cabinet assembly comprising:
a door including at least one hinge for mounting said door to a cabinet for opening and closing said door;
a conduit mounted to said door for carrying at least one of an electrical conductor and a fluid transmission tube;
at least one of an electrical conductor and a fluid transmission tube positioned within said conduit;
at least one connector positioned at a selectable location along said conduit and coupled to said at least one of an electrical conductor and a fluid transmission tube; and
a module for mounting to said door and requiring at least one of electricity and a fluid from said tube for its operation, said module including a module connector for mating with said at least one connector when said module is mounted to said door at a selected location.

2. The cabinet assembly as defined in claim 1 wherein said door is foam insulated and a cavity defining said conduit is formed in said door while the foam insulation is injected.

3. The cabinet assembly as defined in claim 2 wherein said cavity is formed by inserting an elongated tubular mandrel into said door, foaming the insulation around said mandrel, and withdrawing said mandrel.

4. The cabinet assembly as defined in claim 1 wherein said conduit extends vertically along substantially the height of said door.

5. The cabinet assembly as defined in claim 4 wherein a plurality of connectors are coupled to said conduit at spaced locations, wherein each of said connectors are coupled to at least one of an electrical conductor and a fluid transmission tube.

6. The cabinet assembly as defined in claim 5 wherein said door includes an inner liner and an outer skin and wherein said conduit is positioned between said liner and skin.

7. The cabinet assembly as defined in claim 6 wherein said connectors are each selectively covered by a movable cover.

8. The cabinet assembly as defined in claim 7 wherein said movable cover is a plug.

9. The cabinet assembly as defined in claim 7 wherein said movable cover is a sliding plate.

10. The cabinet assembly as defined in claim 5 wherein said door includes an inner liner and an outer skin and wherein said conduit is positioned on a side of said liner facing the cabinet.

11. A cabinet assembly comprising:
a cabinet for refrigerating items;
a door including at least one hinge for mounting said door to said cabinet for opening and closing said door;
a first conduit mounted within said door for carrying at least one of an electrical conductor and a fluid transmission tube;
at least one of an electrical conductor and a fluid transmission tube positioned within said first conduit;
at least one connector coupled to a selectable location along said first conduit and to said at least one of an electrical conductor and a fluid transmission tube;
a second conduit mounted to an inner surface of said door and including a connector for coupling said second conduit to said at least one connector of said first conduit, said second conduit for carrying at least one of an electrical conductor and a fluid transmission tube;
at least one electrical conductor and fluid transmission tube positioned within said second conduit;
at least one connector on said second conduit facing the interior of said cabinet and coupled to said at least one electrical conductor and fluid transmission tube in said second conduit; and
a module for mounting to said door and requiring at least one of electricity and a fluid from said second conduit for its operation, said module including a module connector for mating with said at least one connector of said second conduit when said module is mounted to said door at a selected location.

12. The cabinet assembly as defined in claim 11 wherein a plurality of connectors are coupled to said second conduit at spaced locations, wherein each of said connectors are coupled to at least one of an electrical conductor and a fluid transmission tube in said second conduit.

13. The cabinet assembly as defined in claim 12 wherein said second conduit extends vertically along substantially the height of said door.

14. The cabinet assembly as defined in claim 13 and including a plurality of modules selectively coupled to different locations on said door, wherein each module includes a module connector for coupling to a mating connector on said second conduit.

15. A cabinet assembly comprising;
a door including at least one hinge for mounting said door to a cabinet for opening and closing said door;
a conduit mounted within said door for carrying at least one of an electrical conductor and a fluid transmission tube to locations within said door;
at least one electrical conductor and a fluid transmission tube extending through said hinge and extending within said conduit;
a plurality of connectors coupled to spaced locations along said conduit and to said one of an electrical conductor and a fluid transmission tube; and
at least one module for mounting to said door and requiring at least one of electricity and a fluid from said conduit for its operation, said module including a connector for mating with a selected one of said connectors of said conduit when said module is mounted to said door at a selected location.

16. The cabinet assembly as defined in claim 15 wherein said connectors are each selectively covered by a movable cover.

17. The cabinet assembly as defined in claim 16 wherein said movable cover is a plug.

18. The cabinet assembly as defined in claim 16 wherein said movable cover is a sliding plate.

19. A cabinet assembly comprising:
a door including at least one hinge for mounting said door to a cabinet for opening and closing said door;
a conduit mounted to said door for carrying one of an electrical conductor and a fluid transmission tube;
at least one electrical conductor and a fluid transmission tube position within said conduit;
at least one connector coupled to one or more selectable locations along said conduit and to said one of an electrical conductor and a fluid transmission tube; and
a plurality of modules for mounting to said door wherein at least one module requires at least one of electricity and a fluid from said conduit for its operation, and wherein at least one of said modules includes a module connector for mating with said at least one connector of said conduit when said module is mounted to said door at a selected location, and wherein said at least one module includes a conduit and second connector for coupling to a second module to supply one of electricity and fluid to or through said second module.

20. The cabinet assembly as defined in claim 19 wherein said door is foam insulated and a cavity for receiving said conduit is formed in said door while the foam insulation is injected.

21. The cabinet assembly as defined in claim 20 wherein said conduit extends vertically along substantially the height of said door.

22. The cabinet assembly as defined in claim 21 wherein said door includes an inner liner and an outer skin and wherein said conduit is positioned between said liner and skin.

23. The cabinet assembly as defined in claim 22 wherein said inner liner includes structure for mechanically mounting said plurality of modules to said liner of said door.

* * * * *